United States Patent [19]
Herdt

[11] Patent Number: 5,828,599
[45] Date of Patent: Oct. 27, 1998

[54] MEMORY WITH ELECTRICALLY ERASABLE AND PROGRAMMABLE REDUNDANCY

[75] Inventor: Christian E. Herdt, Monument, Colo.

[73] Assignee: Simtek Corporation, Colorado Springs, Colo.

[21] Appl. No.: 692,571

[22] Filed: Aug. 6, 1996

[51] Int. Cl.[6] ............................... G11C 11/34; G11C 7/00
[52] U.S. Cl. ............................... 365/185.08; 365/185.09; 365/200
[58] Field of Search .................. 365/185.08, 185.09, 365/200, 201, 225.7, 227, 154, 156, 145, 149

[56] References Cited

U.S. PATENT DOCUMENTS

| | | | |
|---|---|---|---|
| 4,422,161 | 12/1983 | Kressel et al. | 365/200 |
| 4,514,830 | 4/1985 | Hagiwara et al. | 365/200 |
| 4,794,568 | 12/1988 | Lim et al. | 365/200 |
| 5,065,362 | 11/1991 | Herdt et al. | 365/154 |
| 5,068,697 | 11/1991 | Noda et al. | 365/185.09 |
| 5,255,228 | 10/1993 | Hatta et al. | 365/200 |
| 5,325,334 | 6/1994 | Roh et al. | 365/201 |
| 5,329,488 | 7/1994 | Hashimoto | 365/200 |
| 5,349,556 | 9/1994 | Lee | 365/200 |
| 5,349,558 | 9/1994 | Cleveland et al. | 365/200 |
| 5,357,473 | 10/1994 | Mizuno et al. | 365/200 |
| 5,381,370 | 1/1995 | Lacey et al. | 365/200 |
| 5,392,245 | 2/1995 | Manning | 365/200 |
| 5,469,390 | 11/1995 | Sasaki et al. | 365/200 |
| 5,539,697 | 7/1996 | Kim et al. | 365/200 |
| 5,563,839 | 10/1996 | Herdt et al. | 365/227 |
| 5,602,776 | 2/1997 | Herdt et al. | 365/185.08 |

*Primary Examiner*—David C. Nelms
*Assistant Examiner*—Trong Quang Phan
*Attorney, Agent, or Firm*—Sheridan Ross P.C.

[57] ABSTRACT

A semiconductor memory device is disclosed that provides replacement of defective main memory portions with operational redundant memory portions. The device includes fuse circuitry that comprises both nonvolatile and volatile memory portions. Because the fuse circuitry includes a volatile memory portion in addition to a nonvolatile memory portion, additional functionality may be achieved by the fuse circuitry. For example, the volatile portion of the fuse circuitry allows the retention of the nonvolatile portion of the circuitry to be tested using standard testing techniques. In addition, the volatile memory portion provides a way for easily utilizing unused redundant memory. In one embodiment of the present invention, a semiconductor memory device is provided that uses nvSRAM cells as the main storage element in the main memory area, the redundant memory area, and in the fuse circuitry.

23 Claims, 5 Drawing Sheets

MEMORY WITH ELECTRICALLY ERASABLE AND PROGRAMMABLE REDUNDANCY

FIELD OF THE INVENTION

The invention relates in general to semiconductor memory devices and, more particularly, to memory devices that include redundant memory portions that may be used to replace defective portions in a main memory area.

BACKGROUND OF THE INVENTION

Semiconductor memory devices are widely used in the computer and electronics industries as a means for retaining digital information. A typical semiconductor memory device is comprised of a large number of memory elements, known as memory cells, that are each capable of storing a single digital bit. The memory cells are arranged into a plurality of separately addressable memory locations, each being capable of storing a predetermined number of digital data bits. All of the memory cells in the device are generally located upon a single semiconductor chip which is contacted and packaged for easy insertion into a computer system.

During the manufacture of semiconductor memory devices, a large number of devices is generally produced on the surface of a single semiconductor wafer. After all of the processing steps are complete, the wafer is placed in a holder and each of the devices on the wafer are tested using a probing device. The testing reveals which of the devices on the wafer are defective (i.e., which devices do not meet minimal operational specifications). After testing, the wafer is scribed and broken up into separate devices and the defective units are discarded.

To increase the percentage yield of a semiconductor wafer (i.e., the percentage of all memory devices on the wafer that meet the required operational specifications), redundant memory portions may be provided for each of the memory devices on the wafer surface. Then, if a portion of the main memory area of a particular memory device on the wafer is found to be defective, a redundant memory portion can be used to replace the defective portion of the main memory area. In this way, a memory device that otherwise would have been discarded can instead be packaged and sold, and the cost per chip can be significantly reduced. To implement the replacement of defective memory portions, redundancy circuitry is generally provided that accesses a predetermined redundant memory portion whenever an access request is received from a host requesting data transfer with a predetermined defective main memory portion. In addition, the redundancy circuitry may deactivate the defective main memory portions when such an access request is received. The redundancy circuitry is generally "programmed" during the manufacture of the memory device to replace each defective main memory portion in the device.

In some memory devices, redundancy circuits are comprised of electrical fuses that are selectively "blown" (i.e., open circuited) so that the defective main memory portion is removed from the memory array and a redundant memory portion is activated to replace it. Two methods are generally used for blowing such fuses, both of which are generally expensive to implement. In a first method, known as the Ohm heating method, the fuses are blown by driving a substantial current through the fuse, thereby melting the conductive material making up the fuse. Because of the large voltages and currents used, the Ohm heating method requires the use of a relatively large amount of silicon area for each device, thereby reducing the number of devices that can be produced on a single wafer. In another method, known as the laser method, the fuses are cut using a laser beam. The laser method requires expensive laser equipment for cutting the fuses and requires a substantial amount of time to perform. Because of the disadvantages of these two methods, redundancy circuits were developed that use nonvolatile memory instead of an electrical fuse. The nonvolatile memory is used to store the address (or other location identifying information) of the defective main memory portion for comparison with the address on an address bus. In this way, a redundant memory portion may be activated whenever the address of the defective main memory portion is received on the address bus. The nonvolatile memory may be programmed electronically and, therefore, the disadvantages associated with "blowing" electrical fuses are avoided. Because the memory used by the redundancy circuit is nonvolatile, the information stored in the memory is not lost when power is removed from the circuit.

Semiconductor memory devices that use nonvolatile memory redundancy circuits to implement redundancy generally require a relatively complex "programming" procedure to be followed to program the address information into the nonvolatile elements in the fuse. This procedure may include, for example, the application of relatively large voltages to the nonvolatile elements in the fuse in a specific sequence to erase prior information and to store new information. Because the programming procedure is complex, past memory devices do not attempt to utilize unused redundant memory for purposes other than implementing redundancy. It would be advantageous, however, if the unused redundant memory in a semiconductor memory device could be used for other purposes to gain maximum benefit from it.

If the nonvolatile memory in a redundancy circuit is defective and cannot retain its programmed information during a period when power is not being applied to the memory device, then the appropriate redundant memory portion will not be activated when a corresponding defective main memory portion is addressed by a host. This may result in the loss of data from the host during a write operation and the delivery of incorrect data to the host during a read operation. Consequently, it is very important that the nonvolatile memory in the redundancy circuit be operating properly. Therefore, it is desirable that means be provided for testing the retention of the nonvolatile memory in the redundancy circuit before the memory device is packaged and sold. In addition, it would be advantageous if the testing could be performed during the normal wafer testing and if the testing were similar to the testing performed on other sections of the memory device, such as the main memory area and the redundant memory area.

SUMMARY OF THE INVENTION

The present invention relates to a semiconductor memory device that utilizes redundancy circuitry having both a volatile and a nonvolatile memory portion. Because the volatile memory portion of the redundancy circuitry is easily programmed (i.e., it does not require a complicated programming procedure to store data), unused redundant memory can be easily accessed for purposes other than providing redundancy. In addition, the volatile portion of the redundancy circuitry enables testing of the retention of the nonvolatile portion using well known techniques during wafer test or thereafter.

In one aspect of the present invention, a semiconductor memory device is provided that includes first and second data storage areas, means for receiving a request from an exterior environment for access to a first data storage location in the first data storage area, and means for accessing a second data storage location in the second data storage area when the first data storage location is in a defective portion of the first data storage area. The means for accessing includes at least one first memory cell having a volatile portion and a nonvolatile portion. In one embodiment, the volatile portion is capable of performing memory functions independently of the nonvolatile portion, such as in an non-volatile, static random access memory (nvSRAM) cell. This independent operation is useful if it is desirable to use portions of the second data storage area for purposes other than defective portion replacement. In another embodiment, the volatile portion is capable of receiving and retaining information from the nonvolatile portion during a recall operation. This recall ability allows the retention of the nonvolatile portion to be tested using well known techniques. In addition, the retention may be tested during wafer test, thereby reducing the amount of time required for performing the tests. In yet another embodiment, an nvSRAM cell is used as the main building block for the entire semiconductor memory device, including the first and second data storage areas and the means for accessing.

In another aspect of the present invention, a semiconductor memory device is provided that includes first and second data storage areas, means for receiving a request from an exterior environment for access to a first data storage location in the first data storage area, means for accessing a second data storage location in the second data storage area when the first data storage location is in a defective portion of the first data storage area, the means for accessing including a nonvolatile memory portion, and means for use in testing the retention of the nonvolatile memory portion. The means for use in testing may include for example, a volatile memory portion coupled to the nonvolatile memory portion. In one embodiment, recall operations may be performed as described above.

In yet another aspect of the present invention, a semiconductor memory device is provided that includes: a main data storage area; a redundant data storage area; means for use in substituting a portion of the redundant data storage area for a defective portion of the main data storage area; and means for utilizing portions of the redundant data storage area that are not used by the means for use in substituting, for performing data storage functions other than defective portion replacement. In one embodiment of the present invention, the means for use in substituting includes a nonvolatile memory for storing location related information corresponding to a defective portion of said main data storage area. The nonvolatile memory may include, for example, the nonvolatile portion of an nvSRAM memory cell. In another embodiment, the means for utilizing includes a volatile memory coupled to the nonvolatile memory and capable of receiving, retaining, and transmitting data independently of the nonvolatile memory. The volatile memory may include, for example, the volatile portion of the nvSRAM cell.

DETAILED DESCRIPTION

The present invention relates to a semiconductor memory device that utilizes redundancy circuitry having both a volatile and a nonvolatile memory portion. The nonvolatile memory portion is operative for storing the address of a defective portion of a main memory area in a nonvolatile form. Because the address data is stored in a nonvolatile form, it is not lost if power is removed from the memory device. The volatile portion is coupled to the nonvolatile portion and is capable of transferring information to and from the nonvolatile portion. In addition, the volatile portion may be used to test the retention of the nonvolatile portion of the redundancy fuse during manufacture or thereafter. Further, the volatile portion allows unused redundant memory in the device to be used as a supplemental memory source.

Figure 1:
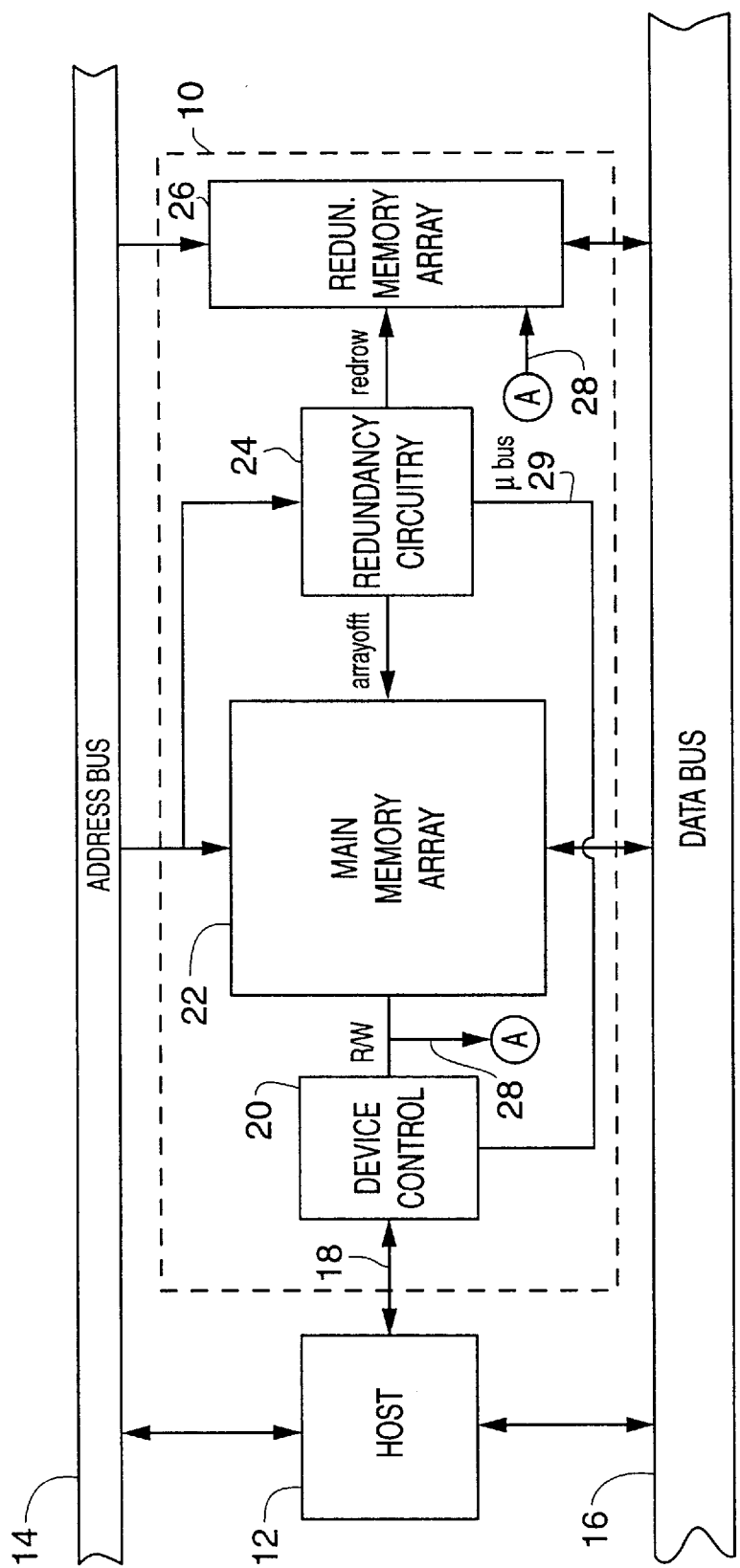
FIG. 1 is a block diagram illustrating a semiconductor memory device in accordance with one embodiment of the present invention.

FIG. 1 illustrates a semiconductor memory device 10 in accordance with one embodiment of the present invention. As illustrated, the device 10 is coupled to a host computer 12 for use by the host 12 in storing and retrieving digital data. The host computer 12 communicates with the semiconductor memory device 10 using an address bus 14, a data bus 16, and command lines 18. The semiconductor memory device 10 includes: a device control unit 20, a main memory array 22, redundancy circuitry 24, and a redundant memory array 26. The host computer 12 outputs addresses of data storage locations in the main memory array 22 that the host computer 12 wants to access onto the address bus 14. The host computer 12 also delivers access requests to the device control unit 20, via command lines 18, that are indicative of whether data is to be read from or written to the data storage location currently being addressed on the address bus 14. The device control unit 20 receives the access requests from the host 12 and indicates to the main memory array 22 and the redundant memory array 26 whether the current access is a read operation or a write operation, via read/write line 28.

Both the main memory array 22 and the redundancy circuitry 24 monitor the address bus 14 to determine which data storage locations in the main memory array 22 are being accessed. If the data storage location currently being accessed is operational, the main memory array 22 simply couples the addressed data storage location to the data bus 16 to perform the requested data transfer. If the addressed data storage location is defective, the redundancy circuitry 24 disables the main memory array 22, or a portion of it, and couples an appropriate redundant data storage location in the redundant memory array 26 to the data bus 16. Data transfer can then take place between the host 12 and the redundant data storage location via data bus 16. The substitution of the redundant data storage location for the addressed data storage location may be fully transparent to the host 12.

As described above, the redundancy circuitry 24 includes both a nonvolatile memory portion and a volatile memory portion. The nonvolatile memory portion is operative for storing the addresses of defective portions of the main memory array 22 in a nonvolatile form so that the address information is not lost if power is removed from the memory device 10. The volatile memory portion of the redundancy circuitry 24 holds the address information during normal operating conditions and is the memory portion that interacts with other parts of the redundancy circuitry 24 during programming and retrieval operations. If system power is lost and then regained, the address data in the nonvolatile memory portion must be transferred to the volatile memory portion before normal operation of the redundancy circuitry 24 may resume.

As is apparent, before the semiconductor memory device 10 can be used in a computer system, the redundancy circuitry 24 must be programmed with the proper address information. This is normally done during wafer test while the device 10 is connected to a tester (not shown). First, a test is done to identify whether there are any defective portions in the main memory array 22. A defective portion may comprise, for example, rows, columns, subrows, subcolumns, or individual data storage locations in the main memory array. In accordance with the present invention, a portion may be considered defective if it contains one or more defective memory cells. If defective portions are identified, the addresses of the defective portions are stored in the memory of the redundancy circuitry 24. The external tester delivers commands to the device control unit 20 instructing the device control unit 20 that a programming operation is to be performed. The device control unit 20 then places the redundancy circuitry 24 into programming mode using microbus 29. The addresses of defective main memory portions are then delivered to the redundancy circuitry 24 via address bus 14. The address data is first transferred into the volatile memory portion of the redundancy circuitry 24 from which it is then transferred into the nonvolatile memory portion.

Figure 2:
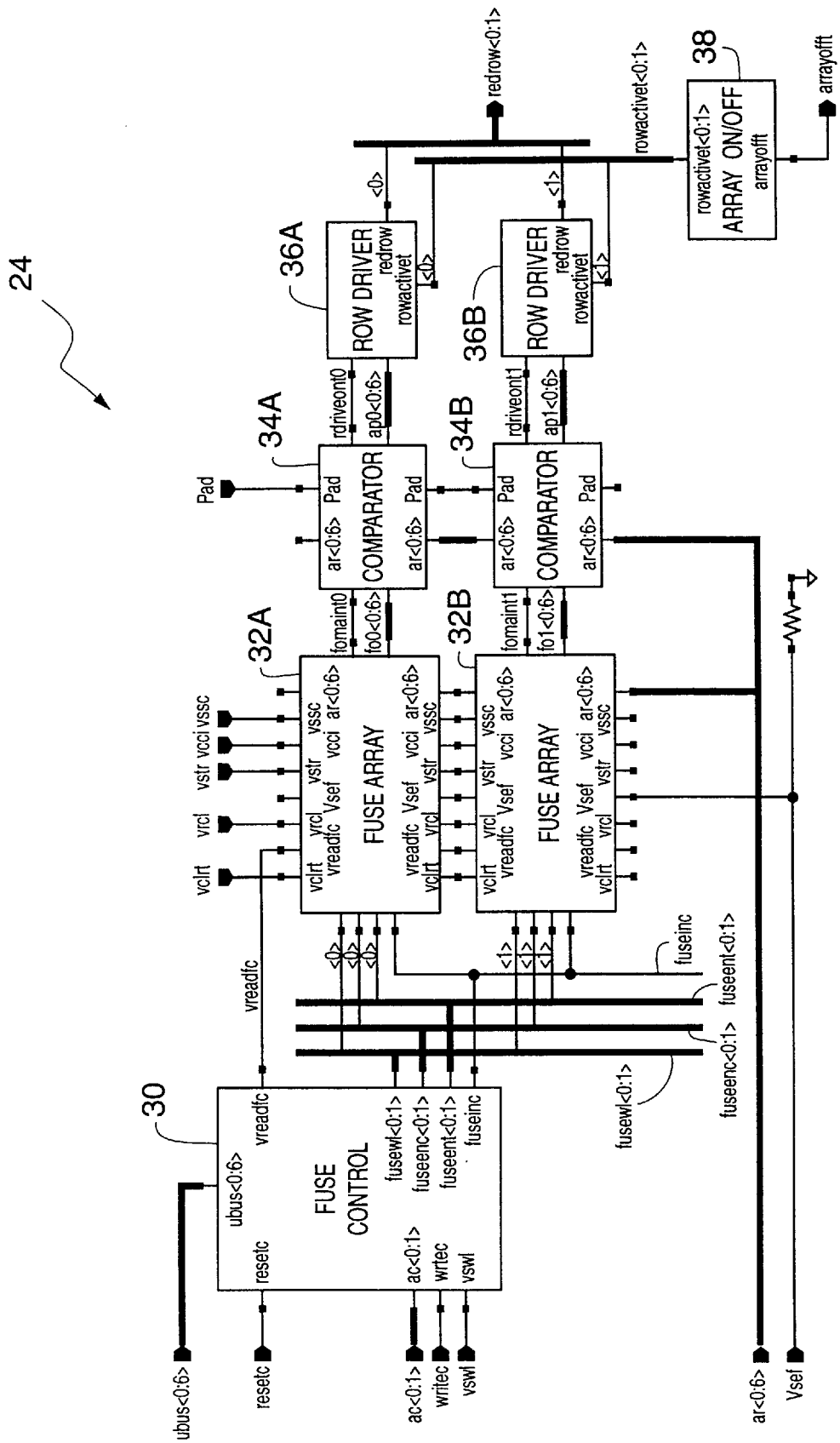
FIG. 2 is a block diagram illustrating redundancy circuitry in accordance with one embodiment of the present invention.

FIG. 2 is a block diagram illustrating the redundancy circuitry 24 in one embodiment of the present invention. The redundancy circuitry 24 of FIG. 2 is operative for replacing two defective rows in the main memory array 22 with redundant rows in the redundant memory array 26. It should be appreciated, however, that any number of defective rows, columns, subrows, subcolumns, or individual data storage locations may be replaced using the techniques of the present invention.

The redundancy circuitry 24 includes: fuse control unit 30, fuse arrays 32A and 32B, comparator units 34A and 34B, row drivers 36A and 36B, and array disable unit 38. The fuse arrays 32A, 32B include both the volatile and the nonvolatile memory portions of the redundancy circuitry 24 and are each operative for storing the address of one corresponding defective main memory row. Each fuse array 32A, 32B also stores a redundant row enable bit that can be used to disable the redundancy function associated with the fuse array. The fuse control unit 30 is operative for, among other things, facilitating the programming of the fuse arrays 32A, 32B with the appropriate addresses. That is, the fuse control unit 30, in conjunction with the external tester (not shown) and the device control unit 20, stores the address of one defective main memory row in each of the fuse arrays 32A, 32B. The device control unit 20 is operative for, among other things, recalling the address information from the nonvolatile memory portion of the fuse arrays 32A, 32B into the volatile memory portion of the fuse arrays 32A, 32B each time the device 10 is turned on.

The comparator units 34A, 34B compare the address information in the volatile portion of the fuse arrays 32A, 32B with the address currently on the address bus 14 to create compare output signals that are delivered to the row drivers 36A, 36B. If the comparison indicates a match between the address stored in one of the fuse arrays 32A, 32B and the address currently on the address bus 14, and the redundant row enable bit stored in that fuse array is a logic one, a corresponding row of the redundant memory array 26 is enabled by one of the row drivers 34A, 34B for data transfer with the host 12 via data bus 16.

The array disable unit 38 is operative for disabling the entire main memory array 22 whenever a row of the redundant memory array 26 is being enabled. Alternatively, the array disable unit 38 can disable a single row of the main memory array 22, a subrow, or even a single memory location of the main memory array 22.

Figure 3:
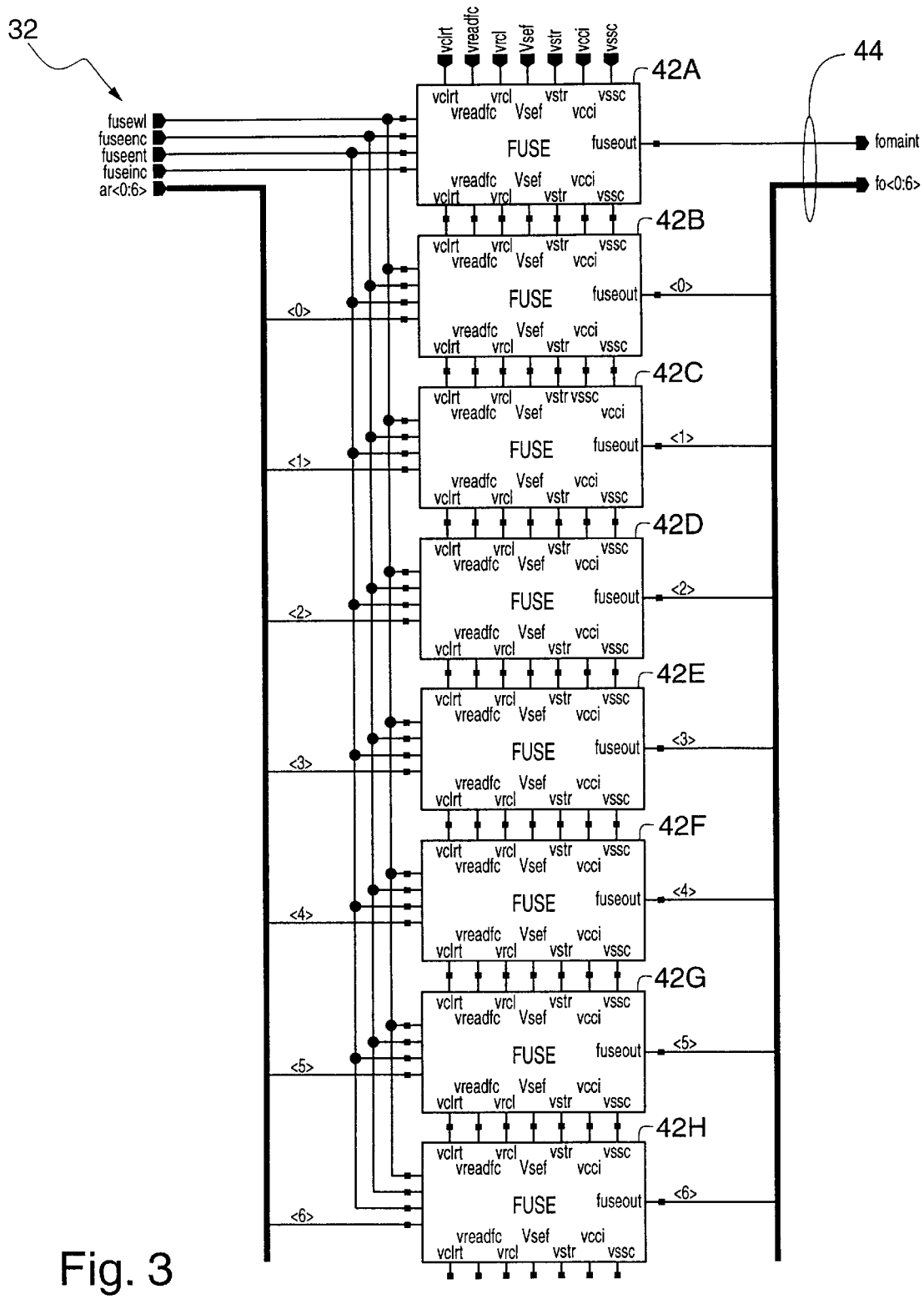
FIG. 3 is a block diagram illustrating a fuse array in accordance with one embodiment of the present invention.

FIG. 3 is a block diagram illustrating one embodiment of a fuse array 32 in accordance with the present invention. As illustrated, the fuse array 32 includes a plurality of fuse circuits 42A–42H connected in parallel to a parallel output bus 44. Each fuse circuit 42A–42H is capable of storing a single bit of data in both volatile and nonvolatile form. During the programming of the fuse array 32, the fuse control unit 30 delivers complementary input enable signals to the fuse array 32 over the enable input lines, fuseent and fuseenc. Each individual fuse circuit 42A–42H receives the input enable signals and is thereafter enabled for the receipt of a data bit. The fuse control unit 30 then delivers a redundant row enable bit to the fuse array 32 over the fuseinc input line, for storage in the first fuse circuit 42A. Address data from the address bus 14 is then transferred to the fuse array 32 via the address lines ar<0:6>for storage in the other fuse circuits 42B–42H. Each fuse circuit 42B–42H receives one address bit of the address data and stores the bit for later use.

Figure 4:
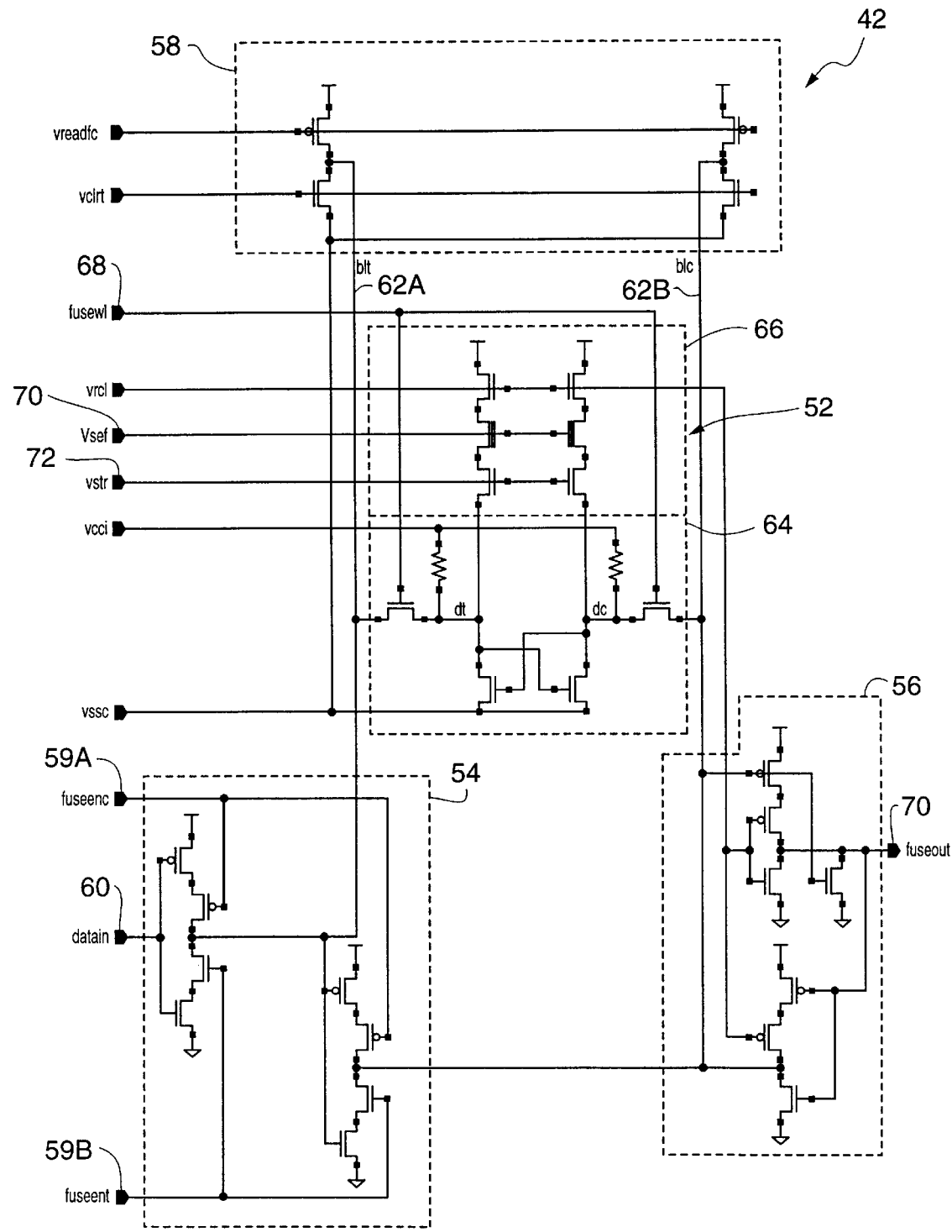
FIG. 4 is a schematic diagram illustrating a fuse circuit in accordance with one embodiment of the present invention.

FIG. 4 is a schematic diagram illustrating a fuse circuit 42 in accordance with one embodiment of the present invention. The fuse circuit 42 includes: an nvSRAM cell 52, fuse input circuitry 54, fuse output circuitry 56, and fuse recall circuitry 58. The nvSRAM cell 52 includes both a volatile portion 64 and a nonvolatile portion 66. Data stored in the volatile portion 64 of the cell 52 will be lost if power is removed from the memory device 10, while data stored in the nonvolatile portion 66 of the cell 52 will be retained if power is removed. The fuse input circuitry 54 is operative for inputting a bit of data to the nvSRAM cell 52 during, for example, a programming procedure. The fuse output circuitry 56 is operative for latching a bit of data, currently stored in the volatile portion 64 of the nvSRAM cell 52, and transferring the bit of data to a corresponding comparator unit 34 via parallel output bus 44. The fuse recall circuitry 58 is operative for facilitating the recall of a data bit stored in the nonvolatile portion 66 of the cell into the volatile portion 64 of the cell 52 and for reducing the power consumed by the fuse circuit 42 during periods when a recall operation is not being performed.

Figure 5:
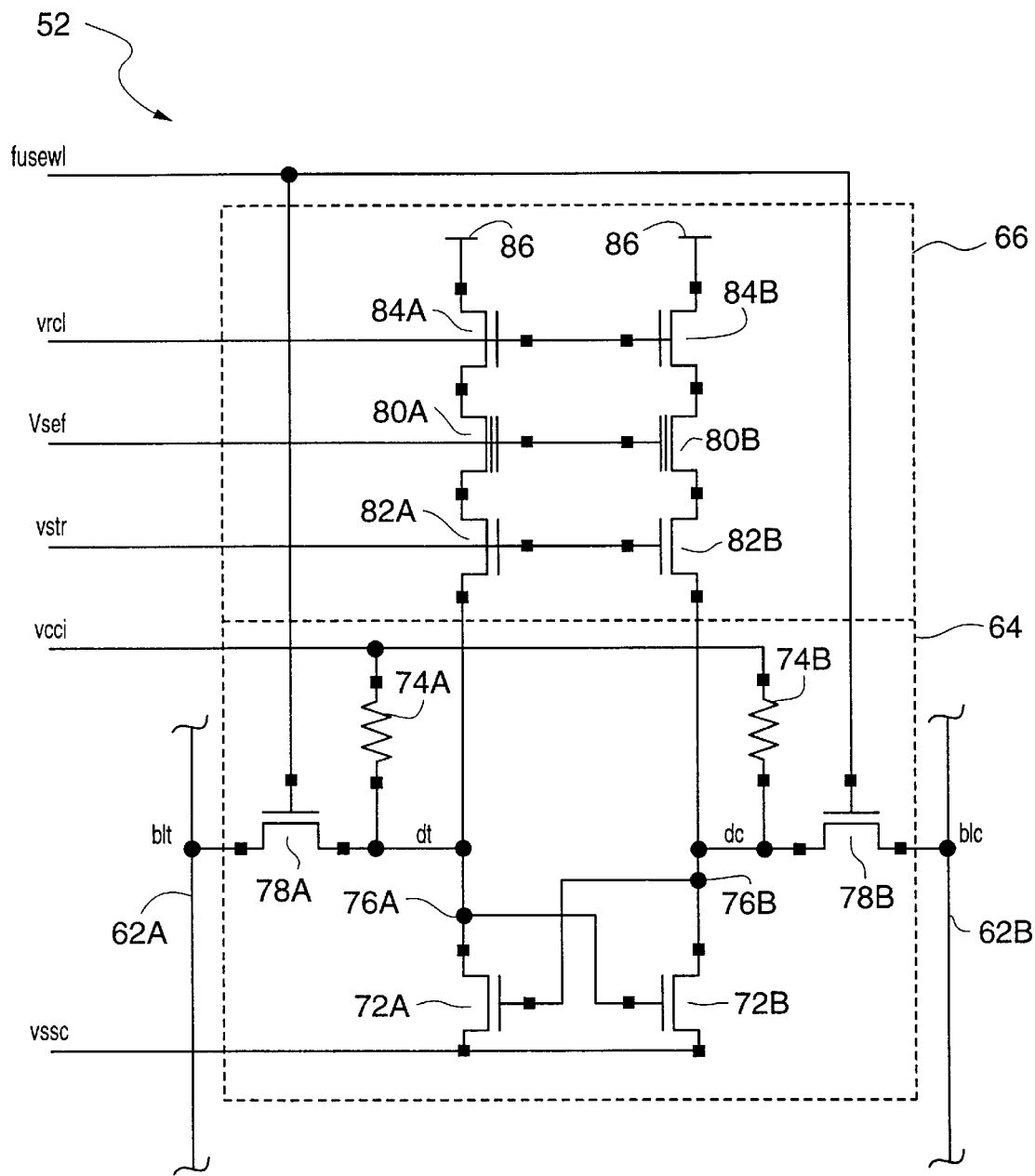
FIG. 5 is a schematic diagram illustrating an nvSRAM memory cell in accordance with one embodiment of the present invention.

FIG. 5 is an expanded view of the nvSRAM cell 52 of FIG. 4. As discussed above, the nvSRAM cell has a volatile portion 64 and a nonvolatile portion 66. As will be described in more detail, a data bit stored in the volatile portion 64 can be transferred to the nonvolatile portion 66 by performing a store operation. Similarly, a data bit stored in the nonvolatile portion 66 can be transferred to the volatile portion 64 by performing a recall operation. During the operation of the redundancy circuitry of FIG. 1, the address information must be located in the volatile portion 64 of the nvSRAM cell 52 for the required comparisons to take place. Therefore, if system power is removed and then replaced, such as when an associated computer system is turned off and then turned on again, a recall operation has to be performed to transfer the address information from the nonvolatile portion 66 to the volatile portion 64.

Generally, nvSRAM cell 52 comprises a plurality of n-channel, Field-Effect Transistors (FETs); a plurality of nonvolatile elements, such as nonvolatile transistors or capacitors; and a plurality of resistors. It should, however, be appreciated that other types of transistors, such as p-channel FETs, and combinations of different types of transistors can be utilized. The volatile portion 64 includes a first SRAM FET 72A and a second SRAM FET 72B that are in a 1-bit latch configuration in which the drain of each FET is coupled to the gate of the other FET and the source of one FET is coupled to the source of the other FET. In the latch configuration, the first and second SRAM FETs 72A, 72B operate as switches that are either in an ON state or an OFF state. More specifically, the latch operates so that when one of the first and second SRAM FETs 72A, 72B is in an ON state the other is necessarily in an OFF state. This manner of operation permits the latch to differentially store a bit of data, which can have either a 0 state or 1 state. For example, if a bit of data is in a 0 state, the latch can represent the 0 state of the bit by placing the first SRAM FET 72A in an ON state and the second SRAM FET 72B in an OFF state. Conversely, if the bit of data is in a 1 state, the latch can represent the 1 state of the bit by placing the first SRAM FET 72A in an OFF state and a second SRAM FET 72B in an ON state.

The volatile portion 64 further includes first and second pull-up resistors 74A, 74B to aid the first and second SRAM FETs 72A, 72B in latching a bit of data from the nonvolatile portion 66 or from an exterior environment. The first pull-up resistor 74A is located between the drain of the first SRAM FET 72A, which is identified as node 76A, and a line that carries a $V_{cci}$ voltage signal. Similarly, the second pull-up resistor 74B is located between node 76B and the line that carries the $V_{cci}$ voltage signal. There are a number of alternatives to the use of pull-up resistors. For example, depletion n-channel FETs or cross-coupled p-channel FETs can be utilized.

Also included in the volatile portion 64 are first and second transfer FETs 78A, 78B for transferring a bit of data between the latch formed by the first and second SRAM FETs 72A, 72B and the exterior environment. The gate of each of the first and second transfer FETs 78A, 78B is connected to a fuse word line (i.e., fusewl); the drains of the first and second transfer FETs 78A, 78B are respectively connected to nodes 76A, 76B; and the sources of the first and second transfer FETs 78A, 78B are respectively connected to bit lines 62A, 62B. The first and second transfer FETs 78A, 78B function as switches that are placed in an ON state to transfer a bit of data between the latch and the bit lines 62A, 62B and otherwise placed in an OFF state. The state of the first and second transfer FETs 78A, 78B (ON or OFF) is controlled by a signal applied to the fuse word line.

The nonvolatile portion 66 includes a first silicon nitride oxide semiconductor (SNOS) FET 80A and a second SNOS FET 80B for respectively storing the state of the first SRAM FET 72A and the second SRAM FET 72B. The state of the first and second SRAM FETs 72A, 72B is stored in the first and second SNOS FETs 80A, 80B by forcing, in a store operation, the threshold voltages for turning ON the first and second SNOS FETs 80A, 80B to reflect the states of the first and second SRAM FETs 72A, 72B. For example, if the first SRAM FET 72A is in an OFF state and the second SRAM FET 72B is in an ON state, the store operation would reflect this state of the first and second SRAM FETs 72A, 72B by forcing the threshold voltage for turning ON the first SNOS FET 80A to be less than the threshold voltage for turning ON the second SNOS FET 80B. This forcing is accomplished by appropriately cycling a $V_{sef}$ signal applied to the gates of SNOS FETs 80A, 80B. It should be appreciated that the SNOS FETs 80A, 80B can be replaced with other types of nonvolatile storage elements, such as silicon oxide nitride oxide semiconductor (SONOS) transistors, floating gate transistors, ferroelectric transistors, and capacitors.

The nonvolatile portion 66 further includes a first store FET 82A and a second store FET 82B that operate as switches during store and recall operations to appropriately configure the nonvolatile portion 66 for the transfer of a bit of data between the volatile portion 64 and the nonvolatile portion 66. More specifically, the first and second store FETs 82A, 82B function to connect the nonvolatile portion 66 to the volatile portion 64 during store and recall operations and to otherwise disconnect the nonvolatile portion 66 from the volatile portion 64. The state of the first and second store FETs 82A, 82B is controlled by a $V_{str}$ signal that is applied to the gates of the FETs. More specifically, if the $V_{str}$ signal is LOW, the first and second store FETs 82A, 82B are turned OFF to disconnect the nonvolatile portion 66 from the volatile portion 64. Conversely, if the $V_{str}$ signal is HIGH, the first and second store FETs 82A, 82B are turned ON to connect the nonvolatile portion 66 to the volatile portion 64.

The nonvolatile portion 66 further includes a first recall FET 84A and a second recall FET 84B that also function as switches to place the nonvolatile portion 66 in the appropriate configuration for transferring a bit of data between the volatile portion 64 and the nonvolatile portion 66 during store and recall operations. More specifically, the first and second recall FETs 84A, 84B function to connect the nonvolatile portion 66 to a power supply 86 during a recall operation and to disconnect the nonvolatile portion 66 from the power supply 86 during a store operation and otherwise. The state of the first and second recall FETs 84A, 84B is controlled by a $V_{rcl}$ signal that is applied to the gates of the FETs. More specifically, if the $V_{rcl}$ signal is LOW, the first and second recall FETs 84A, 84B are turned OFF to disconnect the nonvolatile portion 66 from the power supply 86. Conversely, if the $V_{rcl}$ signal is HIGH, the first and second recall FETs 84A, 84B are turned ON to connect the nonvolatile portion 66 to the power supply 86. In a preferred embodiment of the present invention, the control signals on the $V_{rcl}$, $V_{sef}$, $V_{str}$, and fusewl lines are provided by the device control unit 20.

It should be appreciated that other nonvolatile configurations are possible to achieve the functions of the nonvolatile portion 66 of the cell 52 and the invention is in no way limited to the particular configuration illustrated in FIG. 4. The particular configuration utilized in any application will depend upon both technological and performance criteria.

As described above, with reference to FIG. 4, the fuse input circuitry 54 is operative for inputting a bit of data to the nvSRAM cell 52 during, for example, a programming procedure. The fuse input circuitry 54 is enabled by the fuse control unit 30 delivering an appropriate signal to the complementary enable inputs (i.e., fuseenc 59A and fuseent 59B). After the fuse input circuitry 54 is enabled, the fuse control unit 30 delivers a bit of data to the data input 60 of the circuitry 54. The data bit may represent, for example, a single bit of the address of a defective portion of the main memory array 22 or a redundant row enable bit. The fuse input circuitry 54 thereafter generates a complementary data bit and transfers the original data bit and the complementary data bit to the bit lines (i.e., blt 62A and blc 62B, respectively) connected to the memory cell 52. From the bit lines 62A, 62B, the data bit can be transferred into the volatile portion 64 of the memory cell 52 by applying an appropriate signal to the fuse wordline input (i.e., fusewl 68) thus turning ON the first and second transfer FETs 78A and 78B. From the volatile portion 64 of the memory cell 52, the data bit can then be transferred to the nonvolatile portion by performing a store operation as described above.

The fuse output circuitry 56 is operative for transferring a bit of data currently stored in the volatile portion 64 of the nvSRAM cell 52 to a corresponding comparator unit 34 via parallel output bus 44. An appropriate signal is delivered to the fuse wordline input 68 so that the data bit stored in the volatile portion 64 of the nvSRAM cell 52 is output onto the bit lines 62A, 62B. The fuse output circuit 56 is comprised of a CMOS latch configuration that latches the data bit on the bit lines 62A, 62B. After the fuse output circuitry 56 latches the data bit from the bit lines 62A, 62B, the data bit is transferred to the fuseout line 70 which is connected to the parallel output bus 44. The comparator unit 34 then compares the address data bits output by the fuse circuits 42 to the address currently on the address bus 14. If a match occurs and the corresponding row enable bit is a logic high, the appropriate row of the redundant memory array 26 is enabled and the main memory array 22 is disabled.

As described earlier, the fuse recall circuitry 58 is operative for reducing the level of current consumed by the fuse circuit 42 during normal operation (i.e., when recall operations are not being performed). After the appropriate steps have been taken to transfer the data bit from the nonvolatile portion 66 to the volatile portion 64 of the memory cell 52, the fuse word line 68 is pulsed so that the data bit in the volatile portion 64 is placed onto the bit lines 62A, 62B. This data bit is then latched by the fuse output circuitry 56. After the fuse output circuit 56 latches the data bit, the bit lines 62A, 62B are then "turned off," thereby reducing current consumption in the fuse circuit 42. The bit lines are turned off by the fuse recall circuitry 58 in response to the $V_{readfc}$ signal from the fuse control unit 30 that causes the bit lines 62A, 62B to be held at a known potential. Among other things, this reduces the current that is consumed in the fuse output circuitry 56, which has been found to sink current when a non-CMOS voltage level is present at an input. This ability to reduce the current consumed in the fuse circuitry 42 by controlling the bit line potential significantly increases the practicality of implementing an nvSRAM fuse circuit.

In a preferred embodiment of the present invention, both the main memory array 22 and the redundant memory array 26 of FIG. 1 use nvSRAM data cells, such as the one illustrated in FIG. 5, as the main data storage element. By utilizing the same type of memory cell in the main memory array 22, the redundant memory array 26, and the fuse arrays 32A, 32B, significant design and manufacturing efficiencies can be achieved. It should be appreciated, however, that any type of semiconductor memory cell may be used in arrays 22 and 26 in accordance with present invention.

It is very important that the nonvolatile memory portion of each fuse array 32 be operating properly. If the nonvolatile portion loses the address data that was stored in it during programming, the associated memory device 10 will be relatively worthless. That is, errors will occur every time the host 12 attempts to access a particular defective main memory portion in the main memory area 22 of the device. The present invention allows the retention of nonvolatile fuse memory to be tested before programming. Because the present invention provides both volatile and nonvolatile memory in the redundancy circuitry 24, the retention of the nonvolatile fuse memory can be tested using well known and relatively simple techniques, such as margin mode techniques. In an nvSRAM cell 52, for example, a data bit stored in the nonvolatile portion 66 can be transferred to the volatile portion 64 by performing a recall operation, as described above. By performing a series of recall operations using incrementally changing bias voltages, the operational threshold ranges of the nonvolatile elements (i.e., the SNOS transistors 80A and 80B in the preferred embodiment) can be obtained. These threshold ranges can then be used to estimate, among other things, the lifetime of the nonvolatile retention of the elements. These estimates are particularly accurate in devices that use SNOS and/or SONOS technology, as the failure mechanisms in these devices are relatively predictable.

In addition to the above, the present invention allows the nonvolatile fuse retention to be tested during the normal wafer test procedure, at the same time that the main memory array 22 and the redundant memory array 26 are being tested. This significantly reduces the amount of time required to do the nonvolatile fuse testing because the wafer test procedure, with its inherent setup delays, must be performed regardless of whether nonvolatile fuse testing is performed. Further, if the same type of memory cell is being used in the redundancy circuitry 24 that is being used in the main memory array 22 and the redundant memory array 26, the same test procedure may be used for all of the cells, thereby further reducing the duration and difficulty of the testing. If the nonvolatile portion 66 of a particular fuse circuit 42 is found to be defective during wafer test, the fuse array 32 carrying the defective fuse circuit is not used during programming.

Semiconductor memory devices 10 manufactured in accordance with the present invention will include a predetermined amount of redundant memory. Normally, only a portion of this redundant memory, if any, will need to be used to repair defects in the main memory area of a particular device. In one embodiment, the present invention allows the unused redundant memory in each semiconductor memory device to be used to perform data storage functions other than defective main memory repair. For example, a last redundant memory row can be used to store part tracking information, such as manufacturing date, location of manufacture, design revision number, and lot number, in the memory device 10. This technique can improve the tracking of manufactured material and benefit quality control. In another example, the unused redundant memory can be used to indicate whether the particular part has been repaired, which areas of the main memory portion are defective, which redundant rows are being used, etc. All of this information can be useful during product development.

Because the redundancy circuitry 24 of the present invention includes both volatile and nonvolatile memory portions, and because the volatile portion can be altered without reprogramming (i.e., the volatile portion can be altered independently of the nonvolatile portion), it is relatively easy to store and retrieve information from the unused redundant memory locations. For example, to access a redundant row in the redundant memory array 26 for storage or retrieval of part tracking information, an appropriate redundant row enable bit is transferred to the volatile portion of the first fuse circuit 42A of the appropriate fuse array 32. Because the enable bit is not transferred to the nonvolatile portion of the fuse circuit 42A (i.e., because a store operation is not performed), the bit transfer is relatively easy to perform, as described above. In addition, a predetermined address is collectively stored in the volatile portions of the other fuse circuits 42B–42H.

When tracking data is to be written to or read from the redundant row, the host 12 downloads the predetermined address onto the address bus 14 and sends the appropriate command (i.e., a read or write command) to the memory device 10, via command lines 18. Data is then transferred to/from the redundant memory row via the data bus 16. Because only the volatile portion of the fuse array 32 is used, a complicated programming operation is avoided and the previously programmed nonvolatile data is maintained. The nonvolatile data can be restored to the volatile portion of the fuse array 32 at any time by performing recall operations on the individual fuse circuits 42A–42H.

Although the present invention has been described in conjunction with its preferred embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A semiconductor memory device, comprising:
   a first data storage area comprising a first plurality of data storage locations, said first data storage area being capable of receiving data from an exterior environment, retaining said data, and transmitting said data to said exterior environment;
   a second data storage area comprising a second plurality of data storage locations, said second data storage area being capable of receiving data from an exterior environment, retaining said data, and transmitting said data to said exterior environment;
   means for receiving an access request from said exterior environment requesting a transfer of data between a first data storage location in said first data storage area and said exterior environment; and
   means, in response to said access request, for accessing a second data storage location in said second data storage area for transfer of data between said second data storage location and said exterior environment when said first data storage location is within a defective portion of said first data storage area, wherein said means for accessing includes at least one first memory cell having a volatile portion and a nonvolatile portion, wherein said volatile portion will lose any data located therein if power is removed from said memory device and said nonvolatile portion will retain any data located therein if power is removed from said memory device.

2. The device, as claimed in claim 1, wherein:
   said volatile portion of said first memory cell is capable of receiving, retaining, and transmitting data independently of said nonvolatile portion.

3. The device, as claimed in claim 1, wherein:
   said first memory cell includes a nonvolatile static random access memory (nvSRAM) cell.

4. The device, as claimed in claim 1, wherein:
   said nonvolatile portion of said first memory cell is capable of transferring data to said volatile portion of said first memory cell during a recall operation.

5. The device, as claimed in claim 1, wherein:
   said nonvolatile portion of said first memory cell includes at least one of the following: a silicon nitride oxide semiconductor (SNOS) transistor, a silicon oxide nitride oxide semiconductor (SONOS) transistor, a ferroelectric transistor, and a capacitor.

6. The device, as claimed in claim 1, wherein:
   said first memory cell is used to store location related information corresponding to a defective portion of said first data storage area.

7. The device, as claimed in claim 1, wherein:
   each data storage location in said first data storage area includes at least one second memory cell.

8. The device, as claimed in claim 7, wherein:
   said second memory cell is of the same type as said first memory cell.

9. The device, as claimed in claim 7, wherein:
   said second memory cell includes an nvSRAM cell.

10. The device, as claimed in claim 1, wherein:
    said first data storage area does not include a defective portion.

11. The device, as claimed in claim 1, wherein:
    said first data storage area, said second data storage area, and said means for accessing all utilize the same type of memory cell for performing data storage functions.

12. The device, as claimed in claim 1, wherein:
    said means for accessing includes at least one bit line coupled to said volatile portion of said first memory cell for use in transferring data into and out of said first memory cell;
    latch means, separate from said first memory cell, for latching data on said at least one bit line after said data has been transferred to said bit line from said first memory cell; and
    current reduction means for disabling said bit line after said data has been latched by said latch means.

13. The device, as claimed in claim 1, wherein:
    said current reduction means disables said at least one bit line by holding said at least one bit line at a predetermined potential value.

14. A semiconductor memory device, comprising:
    a first data storage area comprising a first plurality of data storage locations, said first data storage area being capable of receiving data from an exterior environment, retaining said data, and transmitting said data to said exterior environment;
    a second data storage area comprising a second plurality of data storage locations, said second data storage area being capable of receiving data from an exterior environment, retaining said data, and transmitting said data to said exterior environment;
    means for receiving an access request from said exterior environment requesting a transfer of data between a first data storage location in said first data storage area and said exterior environment;
    means, in response to said access request, for accessing a second data storage location in said second data storage area for transfer of data between said second data storage location and said exterior environment when said first data storage location is within a defective portion of said first data storage area, wherein said means for accessing includes a nonvolatile memory portion that will retain any data located therein if power is removed from said semiconductor memory device; and
    means for use in testing the retention of said nonvolatile memory portion.

15. The device, as claimed in claim 14, wherein:
    said means for use in testing includes a volatile memory portion coupled to said nonvolatile memory portion.

16. The device, as claimed in claim 15, wherein:
    said volatile memory portion is capable of receiving and retaining data from said nonvolatile portion during a recall operation.

17. The device, as claimed in claim 16, wherein:

said means for use in testing facilitates the performance of margin mode testing, wherein a threshold voltage range is measured for said nonvolatile memory portion by performing a series of recall operations using varying bias levels.

18. The device, as claimed in claim 14, wherein:

said means for accessing includes a plurality of nvSRAM memory cells.

19. The device, as claimed in claim 14, wherein:

said first data storage area and said second data storage area each include a plurality of nvSRAM memory cells.

20. A semiconductor memory device, comprising:

a main data storage area comprising a first plurality of data storage locations, said first data storage area being capable of receiving data from an exterior environment, retaining said data, and transmitting said data to said exterior environment;

a redundant data storage area comprising a second plurality of data storage locations, said redundant data storage area being capable of receiving data from an exterior environment, retaining said data, and transmitting said data to said exterior environment;

means for use in substituting a portion of said redundant data storage area for a defective portion of said main data storage area; and means for utilizing portions of said redundant data storage area that are not used by said means for use in substituting, for performing data storage functions other than defective portion replacement.

21. The device, as claimed in claim 20, wherein:

said data storage functions other than defective portion replacement include at least one of the following: storing part tracking information and storing product development information.

22. The device, as claimed in claim 20, wherein:

said means for use in substituting includes a nonvolatile memory means for storing location related information corresponding to a defective portion of said main data storage area.

23. The device, as claimed in claim 20, wherein:

said means for utilizing includes volatile memory means coupled to said nonvolatile memory means and capable of receiving, retaining, and transmitting data independently of said nonvolatile memory means.

* * * * *